United States Patent
Nakatani

Patent Number: 6,138,690
Date of Patent: Oct. 31, 2000

[54] METHOD AND AN APPARATUS FOR THE WET TREATMENT OF A SEMICONDUCTOR WAFER

[75] Inventor: Norikazu Nakatani, Tokyo, Japan

[73] Assignee: Mitsubishi Denki Kabushiki Kaisha, Tokyo, Japan

[21] Appl. No.: 08/950,836

[22] Filed: Oct. 15, 1997

[30] Foreign Application Priority Data

Apr. 28, 1997 [JP] Japan .................................. 9-110589

[51] Int. Cl.⁷ .............................. B08B 6/00; C03C 23/00
[52] U.S. Cl. ................................... 134/1.3; 134/2; 216/90
[58] Field of Search ............................ 134/1.3, 2; 216/90

[56] References Cited

U.S. PATENT DOCUMENTS

| | | | |
|---|---|---|---|
| 5,002,618 | 3/1991 | Kanai et al. | 136/258 |
| 5,148,823 | 9/1992 | Bran | 134/184 |
| 5,520,744 | 5/1996 | Fujikawa et al. | 134/11 |
| 5,733,434 | 3/1998 | Harada et al. | 205/746 |

FOREIGN PATENT DOCUMENTS

| | | |
|---|---|---|
| 731498 | 9/1996 | European Pat. Off. . |
| 4209865 | 9/1993 | Germany . |
| 2-309637 | 12/1990 | Japan . |
| 4-6830 | 1/1992 | Japan . |
| 5-96220 | 4/1993 | Japan . |
| 5-315311 | 11/1993 | Japan . |
| 6-097141 | 4/1994 | Japan . |
| 6-326073 | 11/1994 | Japan . |
| 7-230975 | 8/1995 | Japan . |

*Primary Examiner*—Benjamin L. Utech
*Assistant Examiner*—George Goudreau
*Attorney, Agent, or Firm*—McDermott, Will & Emery

[57] ABSTRACT

A method for the wet treatment of a semiconductor wafer comprised of subjecting a semiconductor wafer to chemicals treatment, rinsing with pure water and drying by direct transfer of the wafer to an atmosphere of a vapor containing an alcohol, wherein the semiconductor wafer is treated with a solution containing a semiconductive particle-removing agent during the interval between the steps of the chemicals treatment and the drying. The semiconductive particle-removing agent is one which is able to control the zeta potential of the particles to prevent the deposition of the particles. Alternatively, semiconductive colloid coagulants may be used which inhibit the formation of the particles by coagulation of semiconductive colloids. Thus, deposition of particles on a wet-treated semiconductor wafer is prevented.

7 Claims, 7 Drawing Sheets

Relation between Zeta potential and IPA concentration in the solution for different types of particles Relation between Zeta potential and pH of the solution for different types of particles

METHOD AND AN APPARATUS FOR THE WET TREATMENT OF A SEMICONDUCTOR WAFER

FIELD OF THE INVENTION

This invention relates to a method for the wet treatment of semiconductor wafers in a process of manufacturing semiconductors and also to a wet treating apparatus for conducting the method.

BACKGROUND ART

In the wet treating step of the semiconductor-manufacturing process, it is essential to dry the semiconductor wafer without causing any water marks to be formed on the wafer. In prior art drying techniques, there are known "dry spinning" methods wherein a wafer is rotated to dry by spinning out, and "IPA vapor drying" methods wherein a wafer is transferred to an atmosphere of an IPA vapor and dried. These techniques commonly have the problem that water marks are formed during the course of transfer from final rinsing to drying. Attention has now been made, as a substitute therefor, to techniques of the "Marangoni drying" method, wherein a wafer is dried by transferring from water to an IPA vapor atmosphere, and the "drying by direct substitution with IPA" method, wherein a layer of IPA is formed on the surface of the water to directly substitute the water with IPA.

In the conventional wet treatment methods, a problem arises due to the large size of the treating apparatus. In an apparatus provided with plural chemicals, treating vessels and rinsing vessels, the occupied area of the apparatus has to become large. In order to cope with this problem, it is effective to use an apparatus of the one-bath type wherein pure water and a plurality of solutions of chemicals are fed to one treating vessel.

An apparatus which has been intended to solve these two problems at the same time, is a one-bath type Marangoni dryer or a direct-substitution-with-IPA dryer. The outline of a typical apparatus is shown in FIG. 14. In FIG. 14, a wafer 2 is immersed in a treating vessel (treating chamber) 1 wherein the chemicals solution is upflown from a feed port 3 provided at a lower portion of the treating vessel 1 to etch the wafer 2. Thereafter, pure water is upflown from the feed port 3 for rinsing. The chemicals solution and pure water are overflown from the treating vessel 1 and discharged from a discharge port 4. During the drying of the wafer 2, IPA vapor is introduced from a feed port 5 into an upper space 1a of the treating vessel 1, and the wafer 2 is pulled up therein. This apparatus is of the type wherein the wafer 2 is elevated at the time of the drying.

FIG. 15 is a schematic view of another type of known wet treating apparatus. In this apparatus, a chemicals solution is passed for etching from a feed portion 3 provided at an upper side portion of a treating vessel 1. Subsequently, pure water is passed from the feed port 3 for rinsing. The chemicals solution and pure water are discharged from a discharge port 4 at a lower portion of the treating vessel 1. During the drying of the wafer 2, the level of the pure water in the treating vessel 1 is lowered and, at the same time, IPA vapor is introduced into an upper space of the treating vessel 1, followed by movement of the wafer 2 toward the IPA atmosphere. This apparatus is of the type wherein the water level is dropped at the time of the drying.

It has been found that where a silicon oxide film ($SiO_2$) is etched with hydrofluoric acid (HF) by use of these apparatus, the silicon substrate is deposited with a multitude of silicon particles on the surfaces thereof.

Suppose a Si wafer and a silicon oxide film are simultaneously immersed in a PVC vessel. When the oxide film is etched with HF to a depth of 200 Å and rinsed with water, and then subjected to the Marangoni drying, several thousands of particles are deposited on the Si wafer.

The formation mechanism of the particles are considered as follows.

Where the silicon oxide is etched with hydrofluoric acid, the following reaction (1) proceeds to the right side $$SiO_2 + 6HF = H_2SiO_6 + 2H_2O \qquad (1)$$

When HF is present, the reaction proceeds to the right side. In a rinsing sequence, however, the reaction (1) proceeds to the left side. According to this reverse reaction, $SiO_2$ is generated. The $SiO_2$ is present as $Si(OH)_4$ colloids within the treating vessel, on the wall surfaces of the vessel, and on the surfaces of the wafer.

It has been found that during the "Marangoni drying" method or the "direct-substitution-with-IPA drying" method, IPA which is in the vicinity of the surfaces of the treating vessel in the drying sequence is dissolved and reacts with colloidal $Si(OH)_4$ thereby forming particles. Because of the formation of the particles, the one-bath type "Marangoni dryer" or the "direct-substitution-with-IPA type dryer" has placed limitations on applications thereof.

As stated hereinabove, with the known one-bath type apparatus of the wet treatment of semiconductor wafers, semiconductive particles are inevitably deposited on the semiconductor wafer after drying, thereby presenting a problem in subsequent semiconductor treating processes. If no particles are deposited, this method can be applied to the rinsing step of all the semiconductor wafer treating processes.

SUMMARY OF THE INVENTION

The purpose of the present invention is to provide a wet treating method and apparatus which can solve the prior art problems, wherein little or no semiconductive particles are deposited on a semiconductor wafer after drying, or at least the deposition is significantly reduced, in the wet treatment, particularly in a rinsing process, of a semiconductor wafer using a single treating vessel.

According to one aspect of the present invention, in method for wet treatment of a semiconductor wafer, a semiconductor wafer is treated in a treating vessel with a chemicals solution, rinsed with pure water, and dried by direct transfer to an atmosphere of a vapor containing an alcohol, wherein the semiconductor wafer is treated with a solution containing a semiconductive particle-removing agent during the interval between the treatment with the chemicals solution and the drying.

In this method, the semiconductive particle-removing agent is preferably a semiconductive particle abherent for preventing adhesion of particles by controlling the zeta potential of the particles. The semiconductive particle abherent is preferably selected from either an alcohol, electrolytically ionized water or a surface active agent.

Alternatively, the semiconductive particle abherent comprises a semiconductive colloid coagulant capable of coagulating semiconductive colloids. The semiconductive colloid coagulant is comprised preferably of aluminium sulfate or polyaluminium chloride.

In another aspect of the present invention, in a method for the wet treatment of a semiconductor wafer, the semiconductive particle-removing agent is added to pure water for rinsing, for at least a part of the rinsing process.

According to another aspect of the present invention, in a method for the wet treatment of a semiconductor wafer, the semiconductor wafer is treated with a semiconductive particle-removing agent during the interval between the treatment with the chemicals solution and the drying.

According to another aspect of the present invention, an apparatus for wet treatment of a semiconductor wafer is comprised of a wet treating vessel for wet treating a semiconductor wafer. A means is provided for rinsing the semiconductor wafer after treatment of the semiconductor wafer with a chemicals solution in the wet treating vessel. A means is provided for drying the rinsed semiconductor wafer by direct transfer to an atmosphere of a vapor containing an alcohol. Further, a means is provided for treating the semiconductor wafer with a solution containing a semiconductive particle-removing agent during the interval between the chemicals treatment and the drying.

According to another aspect of the present invention, an apparatus for wet treatment of a semiconductor wafer comprises a means for immersing the semiconductor wafer in a semiconductive particle-removing agent during the interval between the chemicals treatment and the drying.

In another aspect on the present invention, the apparatus for the wet treatment of a semiconductor wafer further comprises a means for collecting the semiconductive particle-removing agent which is discharged from the wet treating vessel, for future use.

Other features and advantages of the present invention will become more apparent from the following description taken together with the accompanying drawings.

BEST MODE OF CARRYING OUT THE INVENTION

This invention will be described in further detail by way of example with reference to the accompanying drawings.

First Embodiment

Figure 1:
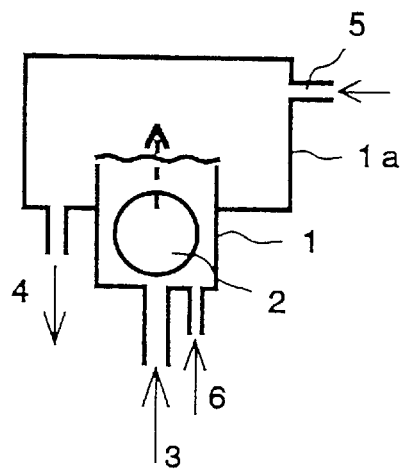
FIG. 1 is a schematic view showing an arrangement of an apparatus for the wet treatment of a semiconductor wafer according to the first embodiment of the present invention.

FIG. 1 is a schematic view showing an arrangement of an apparatus for the wet treatment of a semiconductor wafer according to the first embodiment of the present invention. In FIG. 1, indicated by 1 is a treating vessel (treating chamber); indicated by 1a is the upper space of the treating vessel 1; indicated by 2 is a wafer to be treated; indicated by 3 is a pipe for feeding a chemicals solution and pure water to the treating vessel 1; indicated by 4 is a discharge pipe for discharging the chemicals solution and pure water from the treating vessel after the treatment; and indicated by 5 is a pipe provided at the upper space 1a of the treating vessel 1 to feed IPA vapor necessary for the drying of the wafer 2. Reference numeral 6 indicates an introduction port for introducing a particle-removing agent, or a solution containing a particle-removing agent, from the bottom of the treating vessel.

This wet treating apparatus is of the type wherein the chemicals solution and pure water are, respectively, fed from the feed port 3 at the bottom of the treating vessel 1, and the chemicals solution and the like after the treatment are overflown from the upper portion of the treating vessel 1. Further, the apparatus is of the type wherein the wafer 2 is pulled up from the pure water and the like in the treating vessel.

Figure 2:
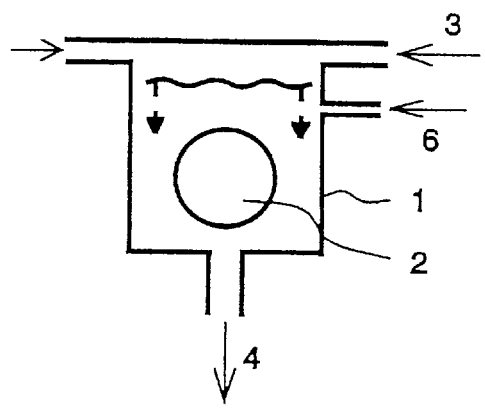
FIG. 2 is a schematic view showing another type of wet treating apparatus of the first embodiment of the present invention.

FIG. 2 is a schematic view showing another type of wet treating apparatus of the first embodiment of the invention. This apparatus is of the type wherein the chemicals solution and pure water are, respectively, fed from the feed port 3, and the chemicals solution and the like after the treatment is discharged from the discharge port 4 provided at the bottom of the treating vessel 1. An additive for particle removal or a solution containing a particle-removing agent is introduced from the introduction port 6 at the upper portion of the vessel 1. After the treatment of the wafer 2, the level of pure water and the like is lowered and the wafer is removed.

In this first embodiment, the chemicals solution of hydrofluoric acid used for etching a silicon oxide film, should usually have an impurity metal concentration of 1 ppm or below, and should contain 100/cc or below of fine particles with a size of 0.2 $\mu$m or below. The pure water for rinsing should have a value of 18 M$\Omega$ or above and contain 5/cc or below of fine particles with a size of 0.05 $\mu$m and above.

Figure 3:
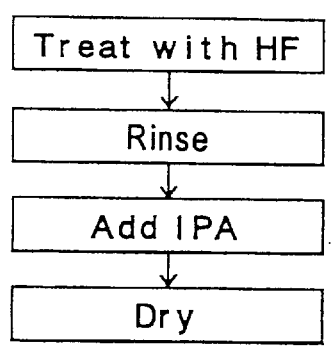
FIG. 3 shows a process of etching a silicon oxide film in the first embodiment of the present invention.

FIG. 3 shows a process of etching a silicon oxide film in this embodiment. As is particularly shown in the sequence of FIG. 3, the film was etched with 0.25 wt % hydrofluoric acid (HF) for 300 seconds, and rinsed with 22 liters/minute of water for 15 minutes. After stopping the feed of the pure water, 300 cc of isopropyl alcohol (IPA, this alcohol may be sometimes referred to as IPA hereinafter) was added as a particle-removing agent, to the treating vessel 1 in which about 20 liters of the pure water was left, following which the wafer was allowed to stand for 5 minutes. Subsequently, the wafer was pulled up at a rate of 5 mm/second in an IPA atmosphere, and particles having a size of 0.17 μm or above were deposited on the wafer, and were found to be 50 or below in number.

Figure 4:
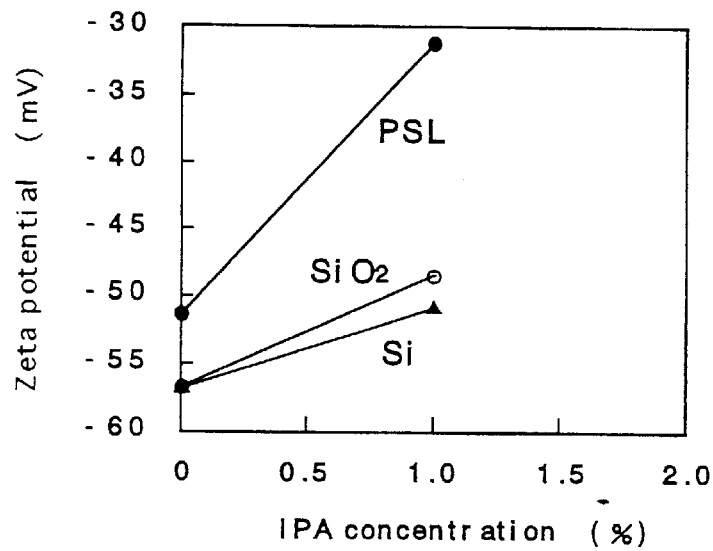
FIG. 4 is a graph showing the relation between the zeta potential and the IPA concentration, in a solution for different types of particles of silicon (Si), silicon oxide film ($SiO_2$) and polystyrene latex.

FIG. 4 is a graph showing the relation between the zeta potential and the IPA concentration in the solution for different types of particles of silicon (Si), silicon oxide film ($SiO_2$) and polystyrene latex. As shown in FIG. 4, as the IPA concentration increases, the absolute value of the zeta potential of the respective types of particles decreases. The zeta potential is a potential on a solid surface in a liquid. The decrease in absolute value of the zeta potential indicates an adhesion force which becomes smaller.

In the above treatment, the particles are formed in the treating vessel 1. Due to the presence of the forcedly added IPA, the absolute value of the zeta potential decreases as shown in FIG. 4, and the particles are unlikely to deposit. Thus, the number of particles deposited on the wafer can be significantly reduced.

Thus, in a process or apparatus of the type wherein, after chemicals treatment in one treating vessel and subsequent rinsing, a semiconductor wafer immersed in very pure water is dried by direct substitution of the water on the surfaces thereof, with a vapor containing an alcohol, a sequence of adding, an alcohol or a solution containing an alcohol, to the treating vessel is provided between the steps of the chemicals treatment and the drying. Because the added alcohol, IPA for example, is very effective, the particles deposited on the wafer after drying can be reduced largely in number.

The process of adding an alcohol set out in this embodiment has been illustrated as an addition to pure water left or remaining after rinsing. Other addition procedures may be used as will be described hereinafter.

Second Embodiment

In a second embodiment of the present invention, a wet treating apparatus shown in FIG. 1 or 2 is used. A hydrofluoric acid solution used to etch a silicon oxide film and pure water for rinsing are those which, respectively, have similar characteristics as illustrated in the first embodiment.

The process of etching a silicon oxide film is similar to that set out with reference to FIG. 3 in connection with the first embodiment, except that in the second embodiment, electrolytically ionized water is used as an additive for removal of the semiconductive particles. In a specific treating instance, where OH-ionized water produced by electrolytic decomposition was added as an electrolytically ionized water, and the wafer was pulled up in an IPA atmosphere, particles having a size of 0.17 m or above and deposited on the wafer were found to be 50 or below in number.

Figure 5:
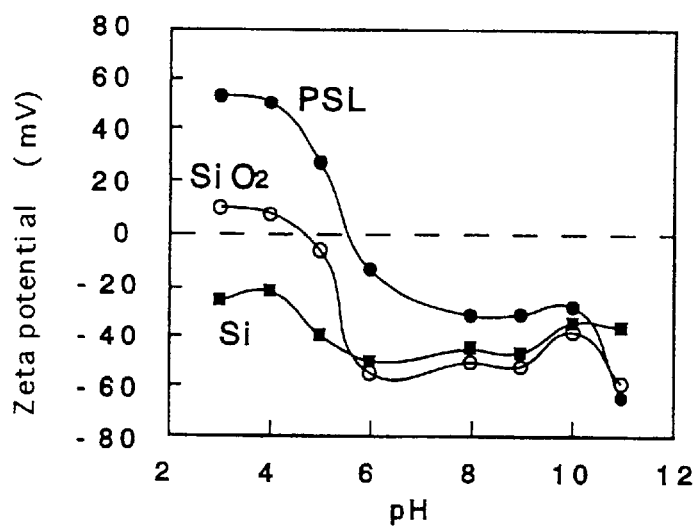
FIG. 5 is a graph showing the relation between the zeta potential and the pH of the solution for different types of semiconductive particles such as silicon (Si), silicon oxide film ($SiO_2$) and polystyrene latex.

FIG. 5 is a graph showing the relation between the zeta potential and the pH of the solution for different types of semiconductive particles such as silicon (Si), silicon oxide film ($SiO_2$) and polystyrene latex. If the solution has a certain level of pH, the zeta potentials of these particles and the Si substrate become the same with respect to the polarity thereof, and the values thereof come close to each other.

In the above treatment, the particles are formed in the treating vessel 1. Since the forcedly added, electrolytically ionized water is alkaline in nature, and the polarities of the zeta potentials become the same as shown in FIG. 5 due to the presence of electrolytically ionized water, the particles are unlikely to deposit. Thus, the particles deposited on the wafer are significantly reduced in number.

Thus, in a process or apparatus of the type wherein, after chemicals treatment in one treating vessel and subsequent rinsing, a semiconductor wafer immersed in very pure water is dried by direct substitution of the water on the surfaces thereof with a vapor containing an alcohol, a sequence of adding electrolytically ionized water to the treating vessel is provided between the steps of the chemicals treatment and the drying. Because the electrolytically ionized water is very effective, OH-ionized water for example, the particles deposited on the wafer after drying can be significantly reduced in number.

The process of adding electrolytically ionized water set out in this embodiment has been illustrated as an addition to pure water remaining after rinsing. Other addition procedures may be used as will be described hereinafter.

Third Embodiment

In the third embodiment of the present invention, a wet treating apparatus is of the type shown in FIG. 1 or 2. A hydrofluoric acid solution used to etch a silicon oxide film and pure water for rinsing are those which, respectively, have similar characteristics as illustrated in the first embodiment.

The process of etching a silicon oxide film is similar to that set out with reference to FIG. 3 in the first embodiment, except that in the third embodiment 3, a surface active agent is used as an additive for removal of semiconductive particles.

In a specific treating instance, after stopping of the feed of pure water for rinsing, an anionic surface active agent was added in an amount of 1 ppm, and the wafer was allowed to stand for 5 minutes. Thereafter, the wafer was pulled up in an IPA atmosphere, whereupon it was found that particles having a size of 0.17 μm or above and deposited on the wafer, were 50 or below in number.

In the above treatment, the particles are formed in he treating vessel. The zeta potential polarity is reversed, owing to the forcedly added surface active agent, and becomes the same as the polarity of the potential of the Si substrate, with the unlikelihood that the particles are deposited on the wafer.

Thus, in a process or apparatus of the type wherein, after chemicals treatment in one treating vessel and subsequent rinsing, a semiconductor wafer immersed in very pure water is dried by direct substitution of the water on the surface thereof, with a vapor containing an alcohol. A sequence of adding a surface active agent or a solution containing a surface active agent to the treating vessel is provided between the steps of the chemicals treatment and the drying. Because the surface active agent added, an anionic or cationic surface active agent, for example, is very effective, the particles deposited on the wafer after drying can be significantly reduced in number.

The process of adding the surface active agent set out in this embodiment has been illustrated as an addition to pure water remaining after rinsing. Other addition procedures may be used as will be described hereinafter.

Fourth Embodiment

In the fourth embodiment of the present invention, a wet treating apparatus is of the type shown in FIG. 1 or 2. A hydrofluoric acid solution used to etch a silicon oxide film and pure water for rinsing are those which, respectively, have similar characteristics as illustrated in the first embodiment.

The process of etching a silicon oxide film is similar to that set out with reference to FIG. 3 in the first embodiment except that in the fourth embodiment, a coagulant capable of coagulating colloidal $Si(OH)_4$ is used as an additive for removal of semiconductive particles. Coagulants such as aluminum sulfate, electrolytic aluminum, polyaluminum chloride and the like have the function of coagulating colloidal $Si(OH)_4$. Thus, a source of forming particles can be removed. In the above treatment, the particles are formed in the treating vessel 1. However, the forcedly added coagulants, such as aluminum sulfate, electrolytic aluminum, polyaluminum chloride and the like, have the function of coagulating colloidal $Si(OH)_4$. Thus, a source of forming particles can be removed.

Thus, in a process or apparatus of the type wherein, after chemicals treatment in one treating vessel and subsequent rinsing, a semiconductor wafer immersed in very pure water is dried by direct substitution of the water on the surfaces thereof, with a vapor containing an alcohol. A sequence of adding a coagulant or a solution containing a coagulant to the treating vessel is provided between the steps of the chemicals treatment and the drying. Aluminum sulfate, electrolytic aluminum, and polyaluminum chloride are very effective as the coagulant. Thus, the particles deposited on the wafer after drying can be significantly reduced in number.

The process of adding the coagulant set out in this embodiment has been illustrated as addition to pure water stayed after rinsing. Other addition procedures may be used as will be described hereinafter.

Fifth Embodiment

In the fifth embodiment of the present invention, a wet treating apparatus is of the type shown in FIG. 1 or 2. A hydrofluoric acid solution used to etch a silicon oxide film and pure water for rinsing, are those which have respectively been illustrated in the first embodiment. A particle- removing agent may be any of those described in the first to fourth embodiments.

Figure 6:
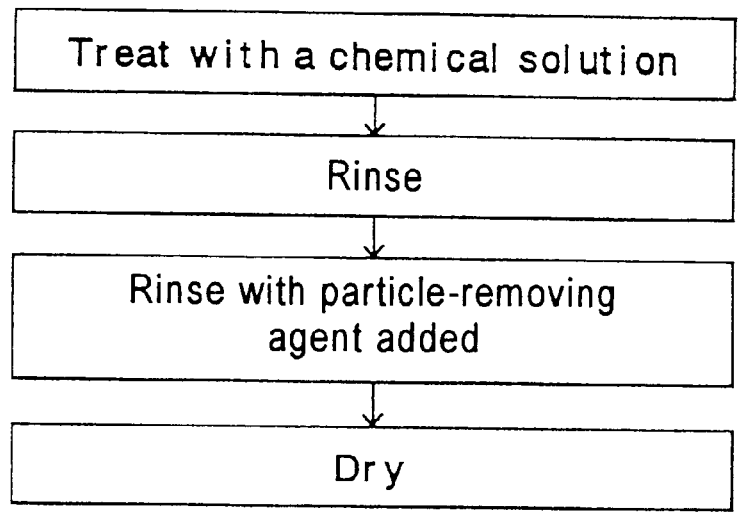
FIG. 6 is a flowchart showing a process of etching a silicon oxide film in accordance with the fifth embodiment of the present invention.

FIG. 6 is a flowchart showing a process of etching a silicon oxide film in accordance with this embodiment.

In a specific example, as shown in a flow chart of FIG. 6, 0.25 wt % of HF is used for etching treatment for 300 seconds, followed by rinsing with 22 liters/minute of water for 15 minutes. After the rinsing, pure water containing a semiconductive particle-removing agent is fed for further rinsing.

The added semiconductive particle-removing agent may be any of the following: alcohol, electrolytically ionized water, surface active agents, and/or coagulants as illustrated in the first to fourth embodiments.

When alcohols, electrolytically ionized water and surface active agents are used as a particle-removing agent, the zeta potential of semiconductive colloids can be changed, so that the removal of absorbed colloids is promoted, thereby eliminating a source for particles. The rinsing with the pure water, to which a particle-removing agent has been added, permits colloidal $Si(OH)_4$ serving as a particle source, to be completely removed and discharged at the time of the rinsing.

Aluminum sulfate, electrolytic aluminum or polyaluminum chloride, which is used as a coagulant additive, is effective for coagulating colloidal $Si(OH)_4$, thereby removing a source for particles. When pure water to which a coagulant for the particles has been added is fed for rinsing, colloidal $Si(OH)_4$, which is a particle source, is coagulated and can be completely removed at the time of rinsing.

As stated above, according to this embodiment, a wafer is treated with a chemical solution and rinsed with water, followed by further rinsing with pure water, to which a particle-removing agent has been added. In doing so, the particle source is discharged along with rinsing water, thereby preventing the particles from deposition on the wafer.

Sixth Embodiment

In the sixth embodiment of the present invention, a wet treating apparatus is of the type shown in FIG. 1 or 2. A hydrofluoric acid solution, used to etch a silicon oxide film, and pure water for rinsing are those which have, respectively, been illustrated in the first embodiment.

Figure 7:
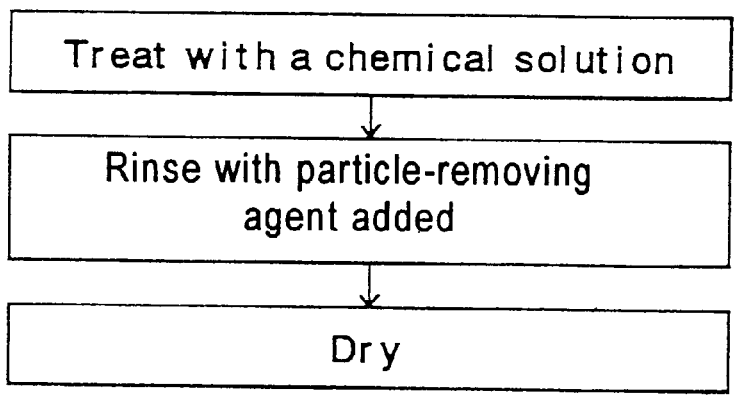
FIG. 7 is a flowchart showing a process of etching a silicon oxide film in accordance with the sixth embodiment of the present invention.

FIG. 7 is a flowchart showing a process of etching a silicon oxide film in accordance with this embodiment.

In a specific example, as shown in a sequence of FIG. 7, 0.25 wt % of HF is used for etching treatment for 300 seconds, followed by feeding pure water for rinsing at a rate of 22 liters/minute for 15 minutes, while adding a semiconductive particle-removing agent. Thereafter, the wafer was pulled up in an IPA atmosphere.

The added semiconductive particle-removing agent may be any of the following: alcohol, electrolytically ionized water, surface active agents, and/or coagulants, as illustrated in the first to fourth embodiments.

When alcohol, electrolytically ionized water or surface active agents are used as a particle-removing agent, the zeta potential of colloids can be changed so that the removal of absorbed colloids is promoted, thereby eliminating a source for the particles. Thus, the colloidal $Si(OH)_4$ which is a source for the particles, can be completely removed at the time of the rinsing.

If an alcohol is added, the concentration of the alcohol may range from the order of magnitude of ppm to 100 wt %. At the time of the rinsing, the invariable addition may be continued.

Where electrolytically ionized water is used, rinsing may be effected using only electrolytically ionized water.

With a surface active agent, the rinsing may be effected while invariably adding the agent.

Using these rinsing procedures, one can obtain not only the effect of suppressing the deposition of the particles, but also the effects of promoting the removal of adsorbed colloids and also the effects of promoting the discharge of the colloids to the outside by means of the running water.

The coagulant such as aluminum sulfate, electrolytic aluminim, polyaluminim chloride or the like which is used as an additive is capable of coagulating colloidal $Si(OH)_4$ and can remove a source for producing particles.

As stated above, in this embodiment, the rinsing is effected, after the chemicals treatment of the wafer, by use of pure water to which a particle-removing agent has been added from the beginning. In doing so, the particle source can be discharged along with the rinsing water thereby preventing the deposition of particles on the wafer.

Seventh Embodiment

In the seventh embodiment of the invention, a wet treating apparatus is of the type shown in FIG. 1 or 2. A hydrofluoric acid solution used to etch a silicon oxide film and pure water for rinsing are those which, respectively, have those characteristics as illustrated in the first embodiment.

Figure 8:
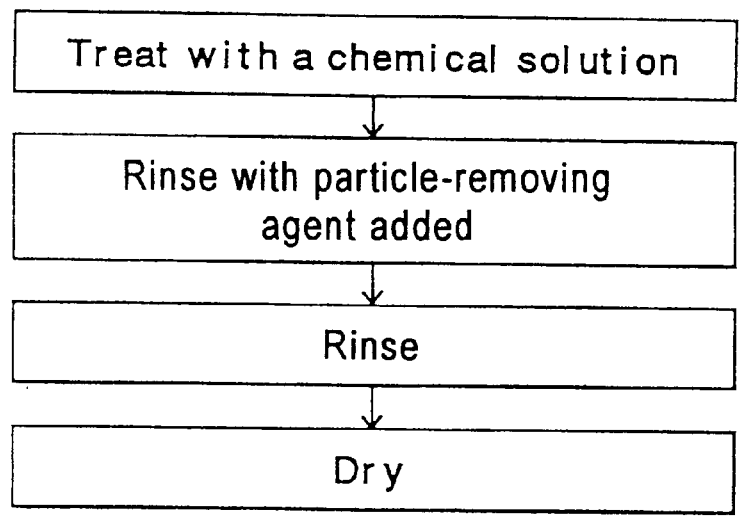
FIG. 8 is a flowchart showing a process of etching a silicon oxide film in accordance with the seventh embodiment of the present invention.

FIG. 8 is a flowchart showing a process of etching a silicon oxide film in accordance with the seventh embodiment.

In a specific example, as shown in a sequence of FIG. 8, 0.25 wt % of HF is used for etching treatment for 300 seconds, followed by feeding pure water for rinsing at a rate of 22 liters/minute for 15 minutes, while introducing an additive for removal of particles and then rinsing with pure water alone.

The introduced additive may be any of the following: alcohol, electrolytically ionized water, surface active agents, and/or coagulants illustrated in the first to fourth embodiments. The functions and effects of these additives are as illustrated in the sixth embodiment and are not repeated herein.

This embodiment is advantageous in that where a coagulant or a surface active agent is added under the apprehension that such a particle-removing agent is left on the wafer surface, a sequence of rinsing with pure water alone is involved after rinsing with pure water containing the particle-removing agent, and the removing agent is thereby prevented from being deposited on the wafer.

Eighth Embodiment

In the eighth embodiment of the present invention, a wet treating apparatus is of the type shown in FIG. 1 or 2. A hydrofluoric acid solution used to etch a silicon oxide film and pure water for rinsing are ones which, respectively, have those characteristics as illustrated in the first embodiment.

Figure 9:
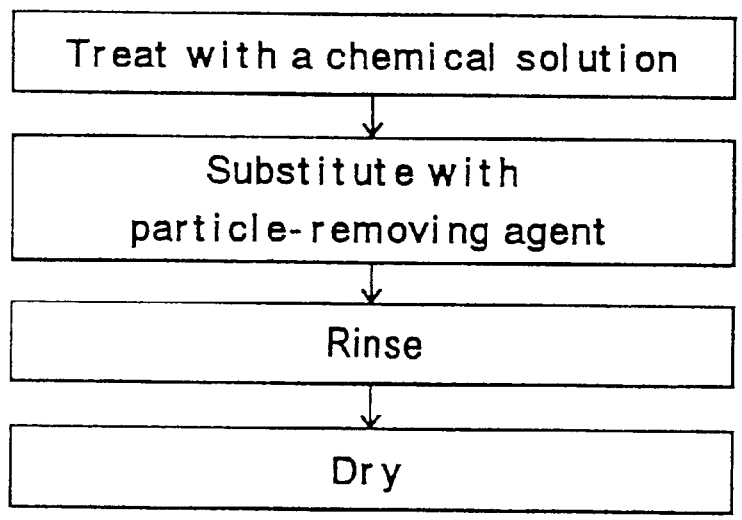
FIG. 9 is a flowchart showing a process of etching a silicon oxide film in accordance with the eighth embodiment of the present invention.

FIG. 9 is a flowchart showing a process of etching a silicon oxide film in accordance with the eighth embodiment.

In a specific example, as shown in a sequence of FIG. 9, 0.25 wt % of HF is used for etching treatment for 300 seconds, followed by substituting the HF aqueous solution with a particle-removing agent and then rinsing with pure water. The resultant wafer is pulled up in an IPA atmosphere. In this case, the substitution with the particle-removing agent would include a case where a particle-removing agent is run for the treatment, and a case where a semiconductor wafer is immersed in a dead particle-removing agent. [0049]

The particle-removing agent used for the substitution may be any of the following: alcohol, electrolytically ionized water, surface active agents, and/or coagulants illustrated in the first to fourth embodiments.

When alcohol, electrolytically ionized water or surface active agents are used as a particle-removing agent, the zeta potential of colloids can be changed, so that the removal of absorbed colloids is promoted, thereby eliminating a source for the particles. Thus, the colloidal $Si(OH)_4$ which is a source for the particles can be completely removed at the time of the rinsing.

Using these rinsing procedures, one can obtain not only the effect of suppressing the deposition of the particles, but also the effects of promoting the removal of adsorbed colloids and also the effects of promoting the discharge of the colloids to the outside by means of the running water.

When the coagulant such as aluminum sulfate, electrolytic aluminum, polyaluminum chloride or the like is used as an additive, colloidal $Si(OH)_4$ can be coagulated thereby removing a source for producing particles. The colloidal $Si(OH)_4$ which is a source for particles, can be completely discharged to the outside at the time of rinsing.

As stated above, in this embodiment, the chemicals solution is substituted with a particle-removing agent, such as an alcohol or electrolytically ionized water, after the chemicals treatment of the wafer. Thereafter, the wafer is rinsed with pure water, followed by placement in an atmosphere of an alcohol vapor. In doing so, the deposition of the particles on the wafer can be prevented.

Ninth Embodiment

In the ninth embodiment of the present invention, a wet treating apparatus is of the type shown in FIG. 1 or 2. A hydrofluoric acid solution used to etch a silicon oxide film and pure water for rinsing are those which, respectively, have those characteristics as illustrated in the first embodiment.

Figure 10:
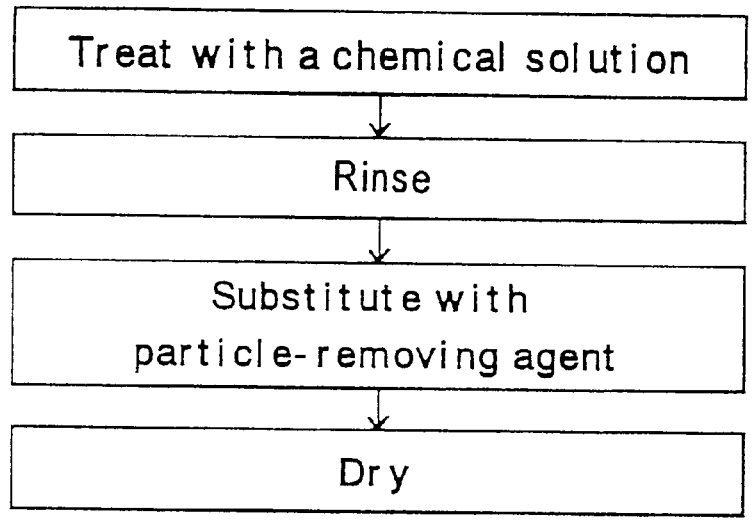
FIG. 10 is a flowchart showing a process of etching a silicon oxide film in accordance with the ninth embodiment of the present invention.

FIG. 10 is a flowchart showing a process of etching a silicon oxide film in accordance with the ninth embodiment. In a specific example, as shown in a sequence of FIG. 10, 0.25 wt % of HF is used for etching treatment for 300 seconds, followed by rinsing with pure water and substituting the pure water with a particle-removing agent. Thereafter, the wafer is pulled up in an IPA atmosphere.

The particle-removing agent used for the substitution may be any of the following: alcohol, electrolytically ionized water, surface active agents, and/or coagulants illustrated in the first to fourth embodiments. The functions and effects of these additives are as illustrated in the eighth embodiment and are not repeated herein.

As stated above, in this embodiment, the pure water in the treating vessel is substituted with a particle-removing agent such as an alcohol or electrolytically ionized water, followed by drying. The substitution with a particle-removing agent includes cases where a particle-removing agent is run or where the semiconductor wafer is immersed in a dead particle-removing agent.

In this way, the deposition of the particles on the wafer can be prevented.

Tenth Embodiment

Figure 11:
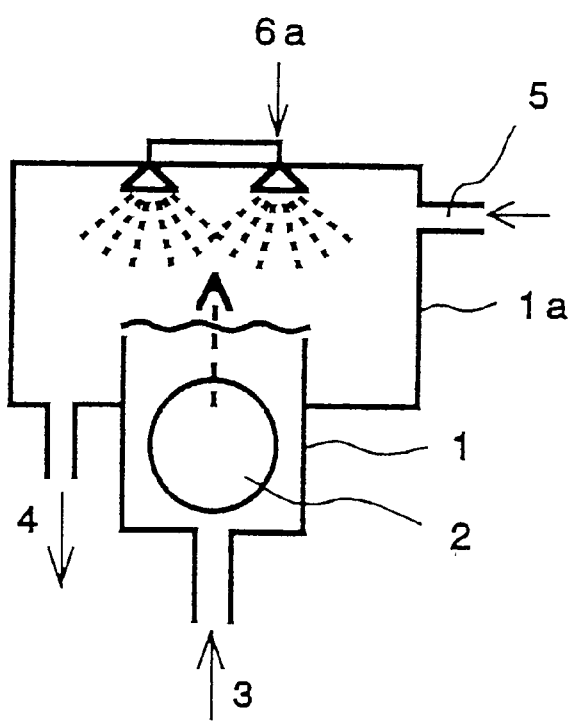
FIG. 11 is a schematic view showing an arrangement of a wet treating apparatus of the tenth embodiment of the present invention.

FIG. 11 is a schematic view showing an arrangement of a wet treating apparatus of the tenth embodiment of the present invention. In FIG. 11, reference numeral 6a indicates sprays provided at a ceiling of the treating vessel 11, from which a particle-removing agent in the form of a liquid phase is sprayed. In this apparatus, a feed portion for chemicals is removed from the apparatus of FIG. 1. Instead, the spray 6a is provided. Other structure is similar to that of FIG. 1 and is not set out herein.

Figure 12:
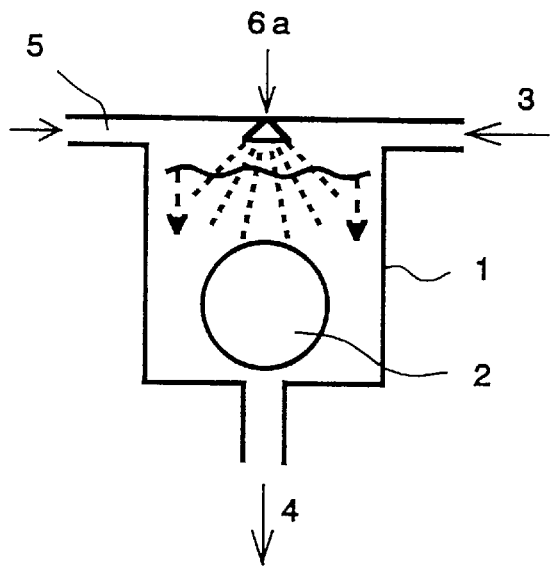
FIG. 12 is a schematic view showing another arrangement of the wet treating apparatus according to the tenth embodiment of the present invention.

FIG. 12 is a schematic view showing another arrangement of the wet treating device according to the tenth embodiment of the present invention. In place of the feed port 6 for chemicals in the apparatus of FIG. 2, a spray 6a for chemicals solution is attached to the ceiling of the treating vessel 1. Other structure is similar to that of FIG. 2 and is not explained herein.

In the tenth embodiment, a hydrofluoric acid solution used to etch a silicon oxide film and pure water for rinsing have respectively those characteristics as illustrated in the first embodiment.

The particle-removing agent used in this embodiment may be any of the following: alcohol, electrolytically ionized water, surface active agents, and/or coagulants illustrated in the first to fourth embodiments.

The manner of addition of the semiconductor particle-removing agent includes spraying a liquid phase of the agent from the ceiling of the treating vessel 1 toward pure water for rinsing. Much of the semiconductive particles are formed in the vicinity of the water surface by reaction between the IPA dissolved, from the IPA atmosphere, in the water in the treating vessel and the colloidal $Si(OH)_4$ in the treating vessel. Accordingly, when the particle-removing agent is predominantly added to the vicinity of the water surface, the particles can be efficiently removed, resulting in the reduction in amount of the agent.

In the first to seventh embodiments, the process of etching a silicon oxide film, includes adding a particle-removing agent from the introduction port 6 to pure water, or substituting the agent with pure water. In contrast, according to this embodiment, a liquid phase agent is sprayed from the ceiling of the treating vessel as set out above. Otherwise, the wafer treating process is similar to that of the first to seventh embodiments and is not repeatedly explained.

In this way, according to this embodiment, the particle-removing agent is supplied predominantly at the boundary between the water and the IPA vapor, thereby causing the particles to be removed efficiently.

Eleventh Embodiment

Figure 13:
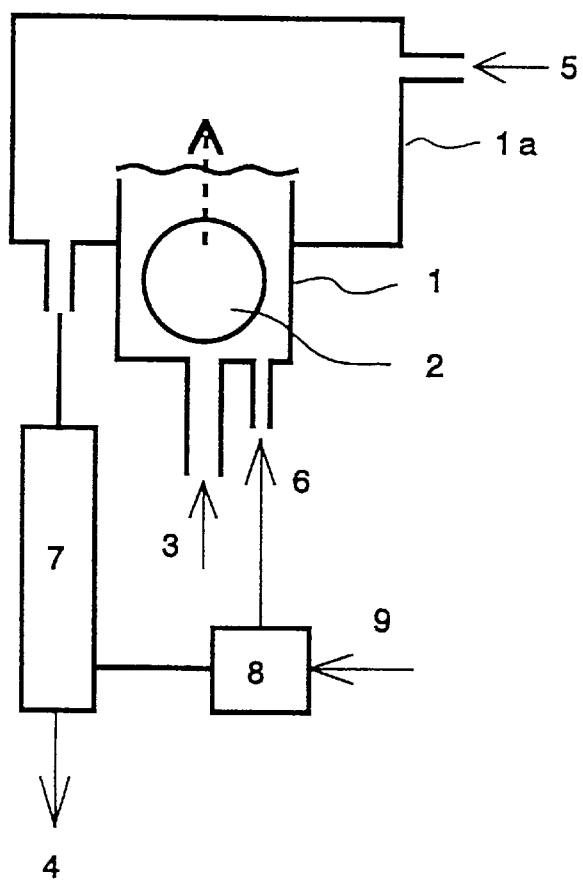
FIG. 13 is a schematic view showing an arrangement of a wet treating apparatus according to the eleventh embodiment of the present invention.
Figure 14:
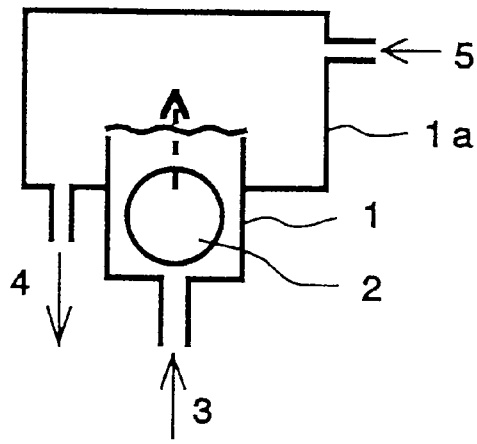
FIG. 14 shows an outline of a typical conventional wet treatment apparatus.
Figure 15:
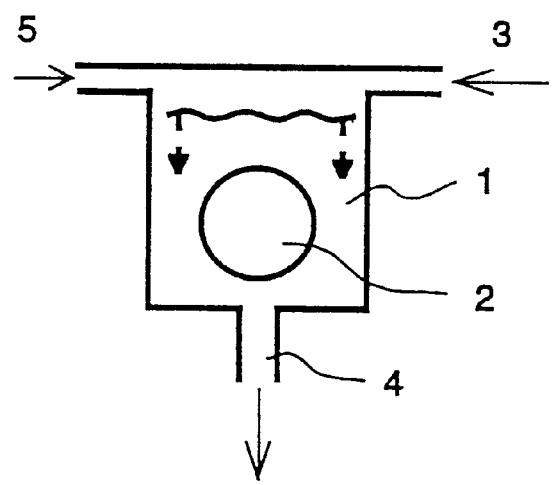
FIG. 15 is a schematic view of another type of conventional wet treating apparatus.

FIG. 13 is a schematic view showing an arrangement of a wet treating apparatus according to the eleventh embodiment of the present invention. In FIG. 13, reference numeral 7 indicates a collecting and purifying means for particle-removing agents such as alcohol. Reference numeral 8 indicates a tank for temporarily storing a collected and purified particle-removing agent such as an alcohol, and reference numeral 9 indicates a port for charging a fresh particle-removing agent.

The treatment of a wafer in a treating vessel 1 is carried out in a manner similar to that illustrated in the first to tenth embodiments. In this embodiment, a particle-removing agent is collected from waste water discharged from a discharge port 4 of the vessel 1, and purified by collecting and purifying means 7, followed by storage in a tank 8. The stored particle-removing agent is re-used by introduction from an introduction port 6 into the vessel 1, along with a fresh particle-removing agent charged from a port 9. Thus, the particle-removing agent such as an alcohol can be effectively used.

The wafer treating process, and the type, function and effect of the particle-removing agent are similar to those of the first to tenth embodiments and are not explained repeatedly.

As described above, the present invention has the following effects and advantages.

According to the present invention, there is provided a process for the wet treatment of a semiconductor wafer, which is comprised of subjecting a semiconductor wafer to chemicals treatment, rinsing with pure water, and drying by direct transfer to an atmosphere of a vapor containing an alcohol, wherein the semiconductor wafer is treated with a solution containing a semiconductive particle-removing agent during the interval between the steps of the chemicals treatment and the drying, whereby the particles can be prevented from being deposited on the wafer, and can be reduced significantly in number.

Further, according to the present invention, the semiconductor wafer may be immersed in a semiconductive particle-removing agent during the interval between the steps of the chemicals treatment and the drying, whereby the particles can be prevented from being deposited on the wafer and can be reduced significantly in number.

Additionally, according to the present invention, a wet treating apparatus for treating a semiconductor wafer is obtained on the basis of the above wet treating method, with which the deposition of the particles on the semiconductor wafer can be prevented or reduced.

Obviously, numerous additional modifications and variations of the present invention are possible in light of the above teachings. It is therefore to be understood that within the scope of the appended claims, the present invention may be practiced otherwise than as specifically described herein.

What is claimed is:

1. A method for wet treatment of a semiconductor wafer which comprises the steps of:

treating a semiconductor wafer in a treating vessel with a chemicals solution;

rinsing said semiconductor wafer with pure water; and drying said semiconductor wafer by direct transfer to an atmosphere of a vapor containing an alcohol;

wherein said semiconductor wafer is treated, either with a solution containing a semiconductive particle-removing agent, or with a semiconductive particle-removing agent during the course between said treatment with the chemicals solution and said drying, wherein said semiconductive particle-removing agent is an agent for preventing adhesion of particles by controlling a zeta potential of the particles, wherein said semiconductive particle-removing agent is added to pure water for rinsing in at least a part of said rinsing process.

2. A method for the wet treatment of a semiconductor wafer according to claim 1, wherein said semiconductive particle-removing agent is added to the pure water left in said treating vessel of said semiconductor wafer, after the pure water has been passed through said treating vessel for rinsing said semiconductor water.

3. A method for the wet treatment of a semiconductor wafer according to claim 1, wherein said semiconductive particle-removing agent is added to the pure water being passed in a part of said rinsing process, wherein the pure water is being passed through said treating vessel for rinsing said semiconductor wafer.

4. A method for the wet treatment of a semiconductor wafer according to claim 3, wherein said semiconductive particle-removing agent is added to the pure water being passed through said treating vessel, of said semiconductor wafer, for rinsing said semiconductor wafer, and thereafter pure water alone is further passed through said treating vessel, of said semiconductor wafer, for rinsing said semiconductor wafer.

5. A method for the wet treatment of a semiconductor wafer according to claim 1, wherein said semiconductive particle-removing agent is added to the pure water being passed during an entire rinsing process, of passing the pure water through said treating vessel.

6. A method for wet treatment of a semiconductor wafer which comprises the steps of:

treating a semiconductor wafer in a treating vessel with a chemicals solution;

rinsing said semiconductor wafer with pure water; and drying said semiconductor wafer by direct transfer to an atmosphere of a vapor containing an alcohol;

wherein said semiconductor wafer is treated, either with a solution containing a semiconductive particle-removing agent, or with a semiconductive particle-removing agent, subsequent to said rinsing of said semiconductor wafer.

7. A method for the wet treatment of a semiconductor wafer according to claim 6, wherein said semiconductive particle removing agent comprises aluminum sulfate or polyaluminum chloride.

* * * * *